United States Patent [19]
Bae

[11] Patent Number: 5,902,493
[45] Date of Patent: May 11, 1999

[54] METHOD FOR FORMING MICRO PATTERNS OF SEMICONDUCTOR DEVICES

[75] Inventor: Sang Man Bae, Ichon-shi, Rep. of Korea

[73] Assignee: Hyundai Electronics Industries Co., Ltd., Rep. of Korea

[21] Appl. No.: 08/755,021

[22] Filed: Nov. 22, 1996

[30] Foreign Application Priority Data

Dec. 15, 1995 [KR] Rep. of Korea ............ 95-50480

[51] Int. Cl.$^6$ ............... G03C 5/00; C25D 5/02
[52] U.S. Cl. ............. 216/47; 216/74; 216/49; 216/13; 156/631.1; 156/640.1; 156/638.1; 156/662.1
[58] Field of Search ............ 216/47, 74, 13, 216/49; 156/631.1, 640.1, 638.1, 662.1

[56] References Cited

U.S. PATENT DOCUMENTS

| | | | |
|---|---|---|---|
| 4,413,051 | 11/1983 | Thomas | 427/43.1 |
| 5,364,493 | 11/1994 | Hunter, Jr. et al. | 156/630 |
| 5,366,848 | 11/1994 | Thane et al. | 430/313 |
| 5,376,225 | 12/1994 | Wakabayashi et al. | 156/643 |
| 5,595,941 | 1/1997 | Okamoto et al. | 437/228 |
| 5,632,908 | 5/1997 | Shahid | 216/2 |
| 5,688,365 | 11/1997 | Ogoshi | 156/661.11 |
| 5,738,757 | 4/1998 | Burns et al. | 156/644.1 |

Primary Examiner—Matthew V. Grumbling
Attorney, Agent, or Firm—Gary M. Nath; Nath & Associates

[57] ABSTRACT

A method for forming accurate micro patterns having a micro dimension smaller than the resolution of a stepper used on a semiconductor substrate, thereby achieving an improvement in the integration degree of the semiconductor device which is ultimately produced. The method includes the steps of coating an under photoresist film over an etchable layer, laminating first and second intermediate films over the under photoresist film, forming patterns of the second intermediate film by use of a first light exposure mask having light shield patterns corresponding to those selected in an interlaced manner from micro patterns to be formed, namely, every second one of adjacent micro patterns, forming patterns of the first intermediate film by use of a second light exposure mask having light shield patterns corresponding to the remaining micro patterns, and patterning the under photoresist film while using the first and second-intermediate film patterns as a mask, thereby obtaining under photoresist film patterns having micro space and line widths.

9 Claims, 3 Drawing Sheets

METHOD FOR FORMING MICRO PATTERNS OF SEMICONDUCTOR DEVICES

BACKGROUND OF THE INVENTION

1. Field of the Invention

The present invention relates to a method for fabricating semiconductor devices, and more particularly to a method for forming accurate micro patterns having a micro dimension smaller than the resolution of a stepper used, on a semiconductor substrate.

2. Description of the Prior Art

Recently developed semiconductor devices have an increased integration degree so that they are able to contain a large number of circuits, thereby being capable of processing and storing an increased quantity of information. The integration of such semiconductor devices depends on the accuracy in forming circuits and lines connecting those circuits together within a limited region. In order to accurately form such circuits and connecting lines, it is required to form photoresist film patterns having a micro dimension. Such photoresist film patterns are used as etch barriers upon conducting an etch process required to form circuits and connecting lines.

Typically, the formation of such photoresist film patterns involves coating with a photoresist film, light exposure and development. The light exposure process is carried out using a photolithograpy device or stepper which serves to irradiate light onto the surface of the photoresist film in such a manner that the photoresist film is selectively exposed to the irradiated light by a light exposure mask. The stepper serves as an important factor for defining micro patterns having a micro dimension. The ability of such a stepper to form a micro pattern is called "a resolution". The resolution R of a stepper can be expressed by the following equation:

$$R = k \times \lambda / NA$$

where, k represents a process constant, $\lambda$ represents the wavelength of light emitted from a light source, and NA (numerical aperture) represents a constant relating to the diameter of the aperture of light passing through a lens equipped in the stepper. However, the above-mentioned parameters, namely, the wavelength of light, the diameter of the aperture of the lens, and the process constant, can not be controlled below certain limits respectively associated therewith. For example, steppers using light sources such as G-line, i-line and excimer lasers respectively having wavelengths of 436, 365 and 248 nm have a limitation in that they have light resolutions capable of forming patterns with dimensions of about 0.5, 0.35 and 0.2 $\mu$m, respectively.

Meanwhile, the light exposure mask should be provided with light shield patterns which are formed on a transparent substrate in such a manner that they have a space width larger than the light resolution of the stepper as used. This is because when the light shield patterns have a space width smaller than the light resolution of the stepper, the surface of the photoresist film may be exposed to light in a wider region than is desired, due to the diffraction of light, thereby resulting in a degradation in contrast. For this reason, known methods of forming micro patterns are problematic in that they can not form micro patterns having a dimension of 0.3 $\mu$m or less by use of i-line ($\lambda$=365 nm) steppers. This results in a difficulty in developing semiconductor devices of 1 Giga DRAM grade.

SUMMARY OF THE INVENTION

Therefore, an object of the invention is to provide a method for forming micro patterns of a semiconductor device which is capable of forming, on a semiconductor substrate, accurate micro patterns having a dimension smaller than the resolution of a stepper as used, thereby achieving an improvement in the integration degree of the semiconductor device.

In accordance with one aspect of the present invention, a method for forming micro patterns of a semiconductor device comprises the steps of: forming an etchable layer over a semiconductor substrate, and coating a first photoresist film over the etchable layer; sequentially laminating a first intermediate film and a second intermediate film exhibiting a different etch selectivity from the first intermediate film over the first photoresist film; coating a second photoresist film over the second intermediate film; exposing the second photoresist film to light by use of a first light exposure mask having light shield film patterns which are arranged on a transparent substrate in such a fashion that they serve to form every second one of adjacent micro patterns, and developing the light-exposed second photoresist film, thereby forming patterns of the second photoresist film; etching the second intermediate film while using the second-photoresist film patterns as a mask, thereby forming patterns of the second intermediate film; coating a third photoresist film over the entire exposed surface of the resulting structure obtained after the formation of the second-intermediate film patterns; exposing the third photoresist film to light by use of a second light exposure mask having light shield film patterns which are arranged on a transparent substrate in such a fashion that they serve to form the remaining micro patterns, and developing the light-exposed third photoresist film, thereby forming patterns of the third photoresist film; etching the first intermediate film while using the third-photoresist film patterns as a mask, thereby forming patterns of the first intermediate film; removing the second and third-photoresist film patterns, and etching the first photoresist film while using the first and second-intermediate film patterns as a mask, thereby forming patterns of the first photoresist film; and etching the etchable layer while using the first-photoresist film patterns as a mask, thereby forming the micro patterns.

In accordance with another aspect of the present invention, a method for forming micro patterns of a semiconductor device comprises the steps of: forming an etchable layer over a semiconductor substrate, and coating a first photoresist film over the etchable layer; sequentially laminating a first intermediate film and a second intermediate film exhibiting a different etch selectivity from the first intermediate film over the first photoresist film; depositing an anti-reflection film over the second intermediate film, and coating a second photoresist film over the anti-reflection film; exposing the second photoresist film to light by use of a first light exposure mask having light shield film patterns which are arranged on a transparent substrate in such a fashion that they serve to form every second one of adjacent ones of the micro patterns, and developing the light-exposed second photoresist film, thereby forming patterns of the second photoresist film; etching exposed portions of the anti-reflection film and second intermediate film while using the second-photoresist film patterns as a mask, thereby forming patterns of the second intermediate film; coating a third photoresist film over the entire exposed surface of the resulting structure obtained after the formation of the second-intermediate film patterns; exposing the third photoresist film to light by use of a second light exposure mask having light shield film patterns which are arranged on a transparent substrate in such a fashion that they serve to form the remaining micro patterns, and developing the light-exposed third photoresist film, thereby forming patterns of the third photoresist film; etching exposed portions of the anti-reflection film and first intermediate film while using the third-photoresist film patterns as a mask, thereby forming patterns of the first intermediate film; removing the second and third-photoresist film patterns, and etching exposed portions of the first photoresist film while using the first and second-intermediate film patterns as a mask, thereby forming patterns of the first photoresist film; removing the anti-reflection film, first-intermediate film patterns and second-intermediate film patterns; and etching the etchable layer while using the first-photoresist film patterns as a mask, thereby forming the micro patterns.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 1 to 8 illustrate sequential steps of a method for forming micro patterns of a semiconductor device in accordance with an embodiment of the present invention, respectively.

Figure 1:
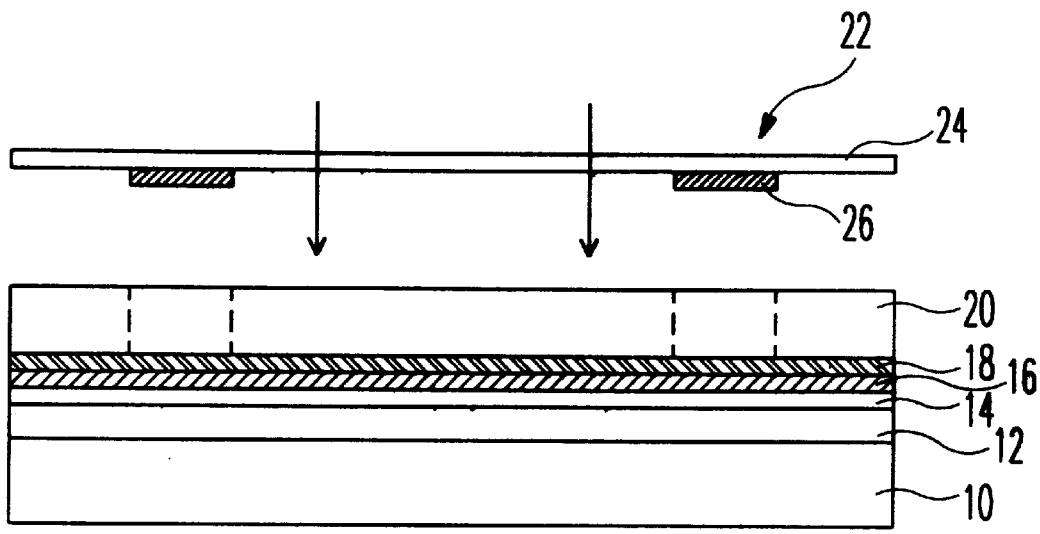
FIGS. 1 to 8 are sectional views respectively illustrating sequential steps of a method for forming micro patterns of a semiconductor device in accordance with an embodiment of the present invention.

In accordance with this method, a first photoresist film 12 is first coated over an etchable layer 10, and first and second intermediate films 14 and 16 are sequentially laminated over the first photoresist film 12, as shown in FIG. 1. The first and second intermediate films 14 and 16 have different etch selectivities. An anti-reflective film 18 is then deposited over the second intermediate film 16. A second photoresist film 20 is coated over the anti-reflective film 18. Subsequently, the second photoresist film 20 is exposed to light using a first light exposure mask 22. This light exposure mask 22 has light shield patterns 26 which are arranged on a transparent substrate 24 in such a fashion that they correspond to every second one of adjacent light shield patterns in the case of conventional light exposure masks usable in forming the same micro patterns as those desired in the present case.

The anti-reflection film 18 is adapted to minimize the reflection of light from the second intermediate film 16 where the second intermediate film 16 is comprised of a metal layer. If the second intermediate film 16 is made of a material exhibiting a low reflection factor with respect to light, the deposition of the anti-reflection film 18 may be omitted.

The first photoresist film 12 has a thickness of 3,000 to 7,000 Å whereas the first intermediate film 14 is comprised of a titanium nitride (TiN) or titanium (Ti) layer deposited to a thickness of 100 to 1,000 Å. On the other hand, the second intermediate film 16 is made of a material exhibiting an etch selectivity higher than that of the first intermediate film 14. The material of the second intermediate film 16 may be an aluminum alloy. The second intermediate film 16 has a thickness of 500 to 5,000 Å. The anti-reflection film 18 is made of an organic compound and has a thickness of 1,000 to 4,000 Å. For the second photoresist film 20, a positive photoresist film is employed.

Figure 2:
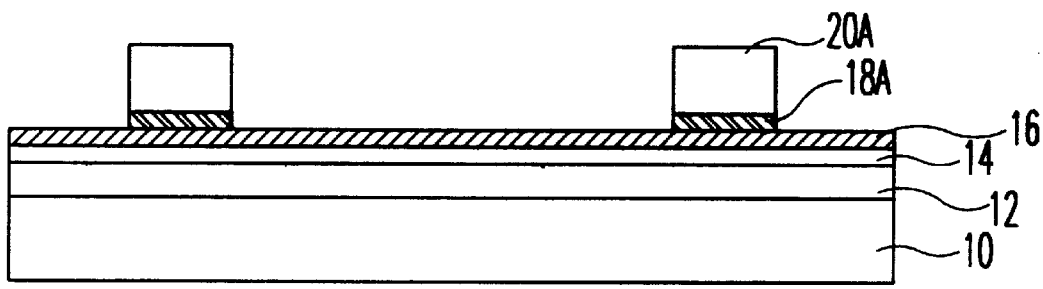
Figure 3:
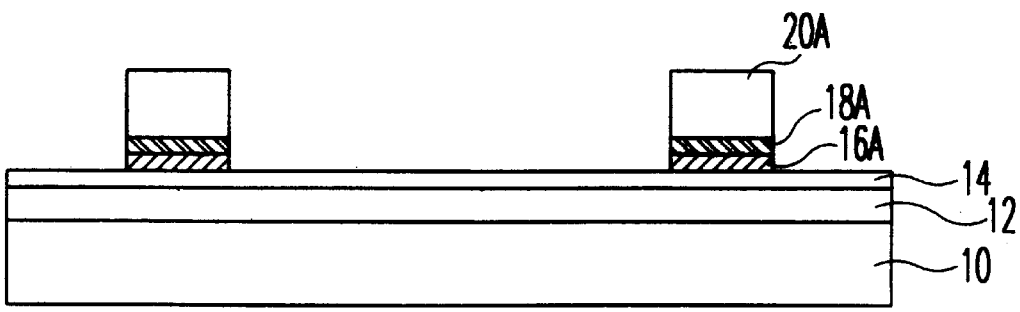

Thereafter, the second photoresist film 20 is developed to form patterns 20A thereof, as shown in FIG. 2. Using the second-photoresist film patterns 20A as a mask, the exposed portions of the anti-reflection film 18 are then etched, thereby forming anti-reflection film patterns 18A.

In the process of etching the anti-reflection film 18, the second-photoresist film patterns 20A may be removed to a desired depth.

Subsequently, the exposed portions of the second intermediate film 16 not covered with the anti-reflection film patterns 18A are removed using a dry etch process which may be a plasma etch process. As a result, patterns 16A of the second intermediate film 16 are obtained. During this etching, the first intermediate film 14 serves as an etch stop layer.

Figure 4:
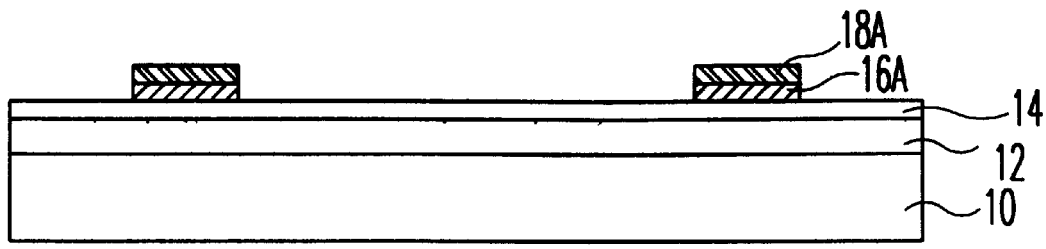

After the formation of the second-intermediate film patterns 16A, the second-photoresist film patterns 20A are removed. This state is illustrated in FIG. 4. Of course, a subsequent process of coating another photoresist film may be carried out without removing the second-photoresist film patterns 20A.

Figure 5:
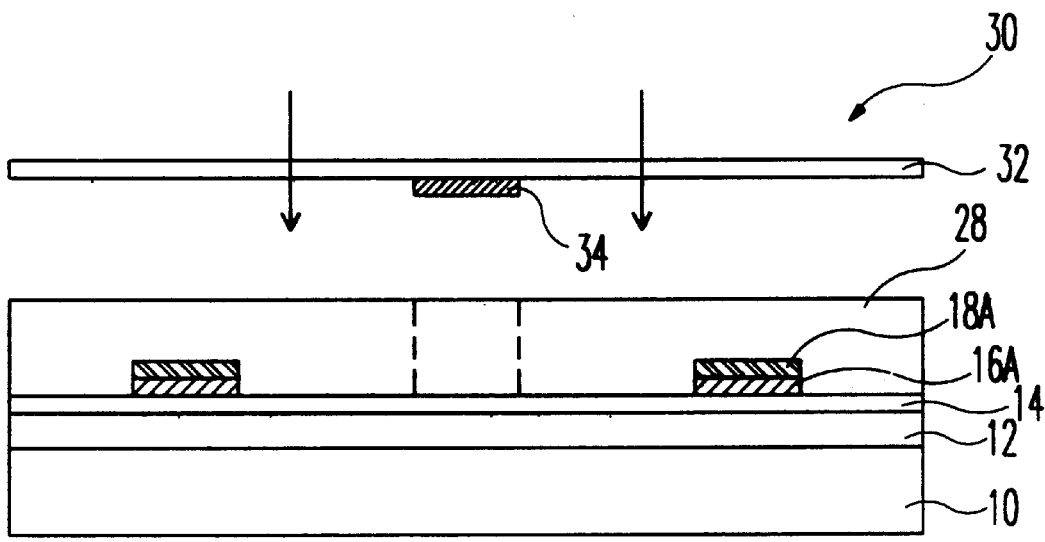

A third photoresist film 28 is then coated over the entire exposed surface of the resulting structure obtained after the removal of the second-photoresist film patterns 20A, as shown in FIG. 5. The third photoresist film 28 is then exposed to light using a second light exposure mask 30. This second light exposure mask 30 has light shield patterns 34 which are arranged on a transparent substrate 32 in such a fashion that they correspond to light shield patterns omitted from the first light exposure mask 22, so as to form those omitted upon forming photoresist film patterns by use of the first light exposure mask 22.

The third photoresist film 28 is coated to a thickness capable of completely covering the anti-reflection film patterns 18A, so that it has a planarized upper surface.

The region where the third photoresist film 28 is shielded from light upon carrying out the light exposure process is a region defined between adjacent second-intermediate film patterns 16A or adjacent anti-reflection film patterns 18A while being spaced from those patterns. In other words, this region does not overlap with the light shield film patterns 26 of the first light exposure mask 22. This means that the light shield film patterns 26 and 34 of the first and second light exposure masks 22 and 30 have a space width larger than the wavelength of light used upon carrying out the light exposure process. Accordingly, it is possible to reduce the diffraction of light.

In the process of exposing the third photoresist film 28 to light, the anti-reflection film patterns 18A suppress the second-intermediate film patterns 16A from reflecting the light, thereby minimizing the formation of notches at patterns of the third photoresist film 28 below the second-intermediate film patterns 16A.

Thereafter, the light-exposed portions of the third photoresist film 28 are removed using a development process, thereby forming patterns 28A each arranged between adjacent anti-reflection film patterns 18A, as shown in FIG. 5. The exposed portions of the first intermediate film 14 are then etched under the condition in which the third-photoresist film patterns 28A, adjacent anti-reflection film patterns 18A and adjacent second-intermediate film patterns 16A are used as a mask. As a result, first-intermediate film patterns 14A having a micro space width are obtained.

Figure 6:
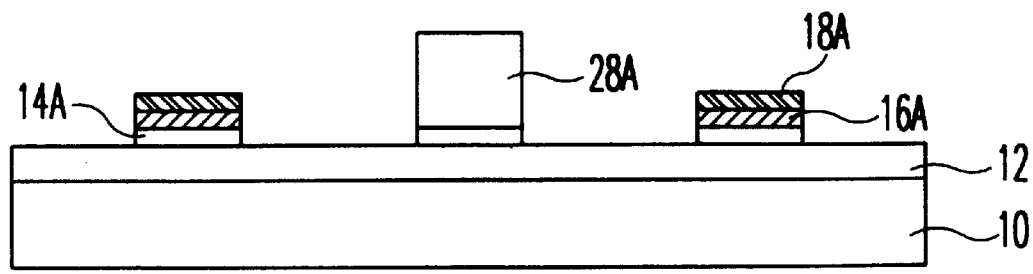
Figure 7:
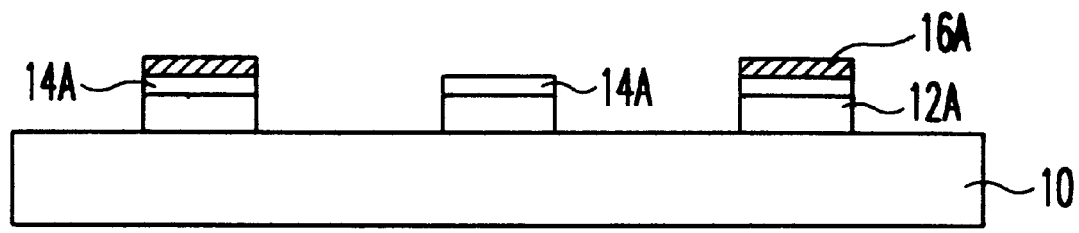
Figure 8:
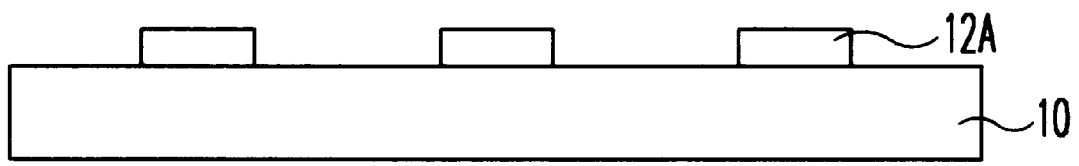

After the completion of the process shown in FIG. 6, the exposed portions of the first photoresist film 12 are dry-etched using $O_2$ plasma under the condition in which the second-intermediate film patterns 16A and first-intermediate film patterns 14A are used as a mask, as shown in FIG. 7. In this way, patterns 12A of the first photoresist film 12 are obtained. The first-photoresist film patterns 12A are disposed beneath the first-intermediate film patterns 14A.

In the dry etch process carried out using $O_2$ plasma, the third-photoresist film patterns 28A disposed on the first-intermediate film patterns 14A are removed along with the anti-reflection film patterns 18A made of an organic compound.

Thereafter, the first and second-intermediate film patterns 14A and 16A disposed on the first-photoresist film patterns 12A are selectively removed. As a result, only the first-photoresist film pattern 12A having a micro line width and a micro space width are left on the etchable layer 10. Finally, the etchable layer 10 is etched using the first-photoresist film patterns 12A as a mask. Thus, desired micro patterns are obtained.

The micro patterns may be formed by etching the etchable layer 10 under the condition in which the first and second-intermediate film patterns 14A and 16A are left on the first-photoresist film patterns 12A.

As is apparent from the above description, in accordance with the present invention, the light exposure process used in the formation of micro patterns is carried out using two light exposure masks which have different light shield patterns respectively corresponding to two groups of the micro patterns selected in an interlaced manner. Accordingly, it is possible to prevent a light diffraction phenomenon from occurring upon carrying out the light exposure process. Furthermore, the photoresist film can be accurately defined into a pattern region and a non-pattern region. Since two groups of photoresist film patterns are formed in a sequential manner and then composed, desired micro patterns having a micro space dimension can be accurately obtained.

In accordance with the present invention, it is also possible to obtain a light resolution corresponding to at least two times that obtained in the case using a single light exposure mask. An increased process margin is also obtained. By virtue of the increased light resolution and process margin, micro patterns can be accurately formed by use of conventional steppers. Moreover, semiconductor devices of an integration degree higher than the limit (for example, 1 Giga) can be fabricated. In accordance with the present invention, the photoresist film is uniformly formed using a metal exhibiting a tensile strength so that it can be supported by itself. The present invention also provides an advantage in that a variety of materials can be used for micro patterns by virtue of the use of intermediate films made of materials exhibiting a high etch selectivity.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming micro patterns of a semiconductor device comprising the steps of:

forming an etchable layer over a semiconductor substrate, and coating a first photoresist film over the etchable layer;

sequentially laminating a first intermediate film and a second intermediate film exhibiting a different etch selectivity from the first intermediate film over the first photoresist film;

coating a second photoresist film over the second intermediate film;

exposing the second photoresist film to light by use of a first light exposure mask having light shield film patterns which are arranged on a transparent substrate in such a fashion that they serve to form every second one of adjacent micro patterns, and developing the light-exposed second photoresist film, thereby forming patterns of the second photoresist film;

etching the second intermediate film while using the second-photoresist film patterns as a mask, thereby forming patterns of the second intermediate film;

coating a third photoresist film over the entire exposed surface of the resulting structure obtained after the formation of the second-intermediate film patterns;

exposing the third photoresist film to light by use of a second light exposure mask having light shield film patterns which are arranged on a transparent substrate in such a fashion that they serve to form the remaining micro patterns, and developing the light-exposed third photoresist film, thereby forming patterns of the third photoresist film;

etching the first intermediate film while using the third-photoresist film patterns as a mask, thereby forming patterns of the first intermediate film;

removing the second and third-photoresist film patterns, and etching the first photoresist film while using the first and second-intermediate film patterns as a mask, thereby forming patterns of the first photoresist film; and etching the etchable layer while using the first-photoresist film patterns as a mask, thereby forming the micro patterns.

2. The method in accordance with claim 1, wherein the first intermediate film is comprised of a titanium film having a thickness of 100 to 1,000 Å.

3. The method in accordance with claim 1, wherein the second intermediate film is comprised of an aluminum alloy film having a thickness of 500 to 5,000 Å.

4. The method in accordance with claim 1, further comprising the step of removing the first-photoresist film patterns after the formation of the first-intermediate film patterns.

5. The method in accordance with claim 1, further comprising the step of removing the first and second-intermediate film patterns after the formation of the first-photoresist film patterns.

6. A method for forming micro patterns of a semiconductor device comprising the steps of:

forming an etchable layer over a semiconductor substrate, and coating a first photoresist film over the etchable layer;

sequentially laminating a first intermediate film and a second intermediate film exhibiting a different etch selectivity from the first intermediate film over the first photoresist film;

depositing an anti-reflection film over the second intermediate film, and coating a second photoresist film over the anti-reflection film;

exposing the second photoresist film to light by use of a first light exposure mask having light shield film patterns which are arranged on a transparent substrate in such a fashion that they serve to form every second one of adjacent micro patterns, and developing the light-exposed second photoresist film, thereby forming patterns of the second photoresist film;

etching exposed portions of the anti-reflection film and second intermediate film while using the second-photoresist film patterns as a mask, thereby forming patterns of the second intermediate film;

coating a third photoresist film over the entire exposed surface of the resulting structure obtained after the formation of the second-intermediate film patterns;

exposing the third photoresist film to light by use of a second light exposure mask having light shield film patterns which are arranged on a transparent substrate in such a fashion that they serve to form the remaining micro patterns, and developing the light-exposed third photoresist film, thereby forming patterns of the third photoresist film;

etching exposed portions of the anti-reflection film and first intermediate film while using the third-photoresist film patterns as a mask, thereby forming patterns of the first intermediate film;

removing the second and third-photoresist film patterns, and etching exposed portions of the first photoresist film while using the first and second-intermediate film patterns as a mask, thereby forming patterns of the first photoresist film;

removing the anti-reflection film, first-intermediate film patterns and second-intermediate film patterns; and etching the etchable layer while using the first-photoresist film patterns as a mask, thereby forming the micro patterns.

7. The method in accordance with claim 6, wherein the first intermediate film is comprised of a titanium film having a thickness of 100 to 1,000 Å.

8. The method in accordance with claim 6, wherein the second intermediate film is comprised of an aluminum alloy film having a thickness of 500 to 5,000 Å.

9. The method in accordance with claim 6, wherein the anti-reflection film has a thickness of 1,000 to 4,000 Å.

* * * * *